(12) United States Patent
Vogel et al.

(10) Patent No.: US 10,014,702 B2
(45) Date of Patent: Jul. 3, 2018

(54) DEVICE FOR TESTING AND MAINTAINING A HIGH VOLTAGE BATTERY AND USES THEREOF

(71) Applicant: Robert Bosch GmbH, Stuttgart (DE)

(72) Inventors: Markus Vogel, Albershausen (DE); Peter Ostertag, Stuttgart (DE); Siegfried Lehmann, Ebersbach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 242 days.

(21) Appl. No.: 14/443,919

(22) PCT Filed: Sep. 30, 2013

(86) PCT No.: PCT/EP2013/070340
§ 371 (c)(1),
(2) Date: May 19, 2015

(87) PCT Pub. No.: WO2014/079616
PCT Pub. Date: May 30, 2014

(65) Prior Publication Data
US 2015/0318727 A1    Nov. 5, 2015

(30) Foreign Application Priority Data
Nov. 20, 2012   (DE) .................. 10 2012 221 133

(51) Int. Cl.
*H02J 7/00* (2006.01)
*H02J 7/02* (2016.01)
*G01R 31/36* (2006.01)

(52) U.S. Cl.
CPC ........ *H02J 7/0052* (2013.01); *G01R 31/3651* (2013.01); *H02J 7/007* (2013.01);
(Continued)

(58) Field of Classification Search
CPC ........ H02J 7/0052; H02J 7/007; H02J 7/0047; H02J 7/022; H02J 7/027; H02J 2007/0096; G01R 31/3651
See application file for complete search history.

(56) References Cited

U.S. PATENT DOCUMENTS 4,229,687 A * 10/1980 Newman ............... H01M 10/44
320/112
5,397,991 A * 3/1995 Rogers ................ B60L 11/1861
320/125
(Continued)

FOREIGN PATENT DOCUMENTS

CN          101367381 A        2/2009
DE       10 2010 035553          3/2012

*Primary Examiner* — Naum B Levin
(74) *Attorney, Agent, or Firm* — Norton Rose Fulbright US LLP; Gerard Messina

(57) ABSTRACT

A device for servicing/maintaining a high-voltage battery, which has individual battery cells or battery modules, and high-voltage positive and negative terminals, and a battery management system having a data transmission terminal for bidirectionally transmitting management system data between the management system and an information-processing unit, external to the battery. The device includes at least two of: a battery charge device, a battery discharge device, and a battery diagnostic device. A battery charge device brings a battery to a higher charge state, and has positive and negative terminals to be connected to positive and negative battery terminals. A battery diagnostic device checks a battery, and the device, for the presence of internal errors, and to indicate recognized internal errors, and may also produce diagnostic data for the battery state and triggering functions directed to bring the device and/or battery safely into a different state, to operate/test them.

9 Claims, 2 Drawing Sheets

(52) U.S. Cl.
CPC ............ *H02J 7/0047* (2013.01); *H02J 7/022* (2013.01); *H02J 7/027* (2013.01); *H02J 2007/0096* (2013.01)

(56) References Cited

U.S. PATENT DOCUMENTS

| | | | | |
|---|---|---|---|---|
| 5,420,493 A * | 5/1995 | Hargadon | ............ | H02J 7/0068 320/106 |
| 5,656,923 A * | 8/1997 | Schultz | ................ | H02J 7/022 320/108 |
| 5,744,936 A * | 4/1998 | Kawakami | ........ | H01M 10/4207 320/120 |
| 6,104,167 A * | 8/2000 | Bertness | ............... | H02J 7/0008 320/107 |
| 6,762,588 B2 * | 7/2004 | Miyazaki | ............. | H02J 7/0026 320/116 |
| 6,784,637 B2 * | 8/2004 | Raichle | ............. | G01R 31/3648 320/107 |
| 6,791,295 B1 * | 9/2004 | Berels | ................... | B60L 11/14 320/103 |
| 6,885,920 B2 * | 4/2005 | Yakes | ................... | A62C 27/00 180/65.1 |
| 6,988,053 B2 * | 1/2006 | Namaky | ............. | G01R 31/007 320/104 |
| 7,332,881 B2 * | 2/2008 | Clark | ...................... | B60L 3/108 318/139 |
| 7,403,016 B2 * | 7/2008 | Furukawa | ............ | B60L 11/1864 320/116 |
| 7,411,371 B2 * | 8/2008 | Hobbs | .................. | B60L 3/0046 320/128 |
| 7,453,232 B2 * | 11/2008 | Furukawa | ............ | H02J 7/0021 320/104 |
| 7,505,856 B2 * | 3/2009 | Restaino | .......... | G01R 19/16542 320/163 |
| 7,518,340 B2 * | 4/2009 | Sterz | ................... | H02J 7/0068 320/131 |
| 7,528,579 B2 * | 5/2009 | Pacholok | ............... | H02J 7/022 320/130 |
| 7,714,541 B2 * | 5/2010 | Stamos | ................ | H02J 7/0047 320/106 |
| 7,715,884 B2 * | 5/2010 | Book | .................. | H02J 7/0003 320/114 |
| 7,778,746 B2 * | 8/2010 | McLeod | ................ | G07C 5/008 320/109 |
| 7,854,282 B2 * | 12/2010 | Lee | ........................ | B60K 6/405 180/65.24 |
| 8,093,861 B2 * | 1/2012 | Christensen | .......... | B60L 3/0046 320/109 |
| 8,249,910 B2 * | 8/2012 | Wellman | .............. | G05D 1/0282 701/36 |
| 8,587,257 B2 * | 11/2013 | Murakami | .......... | B60L 3/0038 320/134 |
| 8,633,678 B2 * | 1/2014 | Yegin | .................... | B60L 3/0069 320/134 |
| 8,655,535 B2 * | 2/2014 | Oh | ....................... | B60L 15/2045 701/22 |
| 8,736,226 B2 * | 5/2014 | Mukai | .................. | B60L 3/0069 320/104 |
| 8,818,612 B2 * | 8/2014 | Das | ........................ | G07C 5/008 701/31.4 |
| 8,866,441 B2 * | 10/2014 | Weng | .................. | H01M 10/441 307/46 |
| 8,940,427 B2 * | 1/2015 | Noda | ................ | H01M 10/4207 429/100 |
| 9,013,139 B2 * | 4/2015 | Pinnell | .................. | H02J 7/0008 320/106 |
| 9,041,403 B2 * | 5/2015 | Aoki | .................... | H01M 10/482 324/426 |
| 9,124,108 B2 * | 9/2015 | Makhija | .............. | H02J 7/0047 |
| 9,136,719 B2 * | 9/2015 | Ichikawa | ............ | B60L 11/1838 |
| 9,184,605 B2 * | 11/2015 | Chang | ................. | B60L 11/1866 |
| 9,225,201 B2 * | 12/2015 | Sievers | ................. | B60R 21/017 |
| 9,321,350 B2 * | 4/2016 | Yokoyama | ............ | H01M 10/44 |
| 9,350,187 B2 * | 5/2016 | Shreevani | ............. | B60L 3/0023 |
| 9,595,847 B2 * | 3/2017 | Dao | ........................ | H02J 9/061 |
| 9,614,383 B2 * | 4/2017 | Boggs | .................. | H02J 7/0029 |
| 2003/0155892 A1 | 8/2003 | Poletti | .................. | H02J 7/0073 320/137 |
| 2005/0134224 A1 * | 6/2005 | Chuang | ................. | H02J 7/0047 320/132 |
| 2006/0028178 A1 | 2/2006 | Hobbs | | |
| 2006/0145658 A1 * | 7/2006 | Wang | ................... | H02J 7/0047 320/107 |
| 2007/0103113 A1 | 5/2007 | Embrey et al. | | |
| 2007/0229023 A1 * | 10/2007 | Li | ......................... | H02J 7/0004 320/107 |
| 2009/0058355 A1 * | 3/2009 | Meyer | ................. | B60L 11/1822 320/104 |
| 2009/0128159 A1 * | 5/2009 | Nakatsuji | ............. | G01R 31/025 324/433 |
| 2010/0214108 A1 * | 8/2010 | Stamos | ................. | H02J 7/0072 340/636.2 |
| 2010/0315089 A1 * | 12/2010 | Rapich | .................. | H02J 7/0047 324/426 |
| 2011/0140669 A1 * | 6/2011 | Murakami | ............ | B60L 3/0038 320/134 |
| 2011/0144840 A1 * | 6/2011 | Ye | ............................ | B60K 6/46 701/22 |
| 2011/0156651 A1 * | 6/2011 | Christensen | .......... | B60L 3/0046 320/128 |
| 2011/0187377 A1 * | 8/2011 | Boysen | .................. | G01R 31/36 324/426 |
| 2011/0196545 A1 | 8/2011 | Miwa | | |
| 2011/0204853 A1 * | 8/2011 | Shimayama | ...... | H01M 10/4207 320/162 |
| 2011/0248719 A1 * | 10/2011 | Aoki | .................... | H01M 10/482 324/426 |
| 2011/0279082 A1 * | 11/2011 | Hagenmaier, Jr. | .. | B60L 11/1824 320/109 |
| 2012/0217928 A1 * | 8/2012 | Kulidjian | ............... | B60L 3/0069 320/109 |
| 2012/0280655 A1 * | 11/2012 | Schneider | ........... | B60L 11/1824 320/109 |
| 2012/0286729 A1 * | 11/2012 | Yegin | .................... | B60L 3/0069 320/109 |
| 2013/0162196 A1 * | 6/2013 | Li | .......................... | H02J 7/045 320/107 |
| 2013/0308239 A1 * | 11/2013 | Yamada | ................ | H02J 7/0029 361/93.1 |

* cited by examiner

DEVICE FOR TESTING AND MAINTAINING A HIGH VOLTAGE BATTERY AND USES THEREOF

FIELD OF THE INVENTION

The present invention relates to a device for testing and maintaining a high-voltage battery, and to uses of this device.

BACKGROUND INFORMATION

Patent document DE 10 2010 035553 discusses a device, e.g. a vehicle or industrial truck, that is operated with a high-voltage battery and has a battery receptacle space that accommodates the high-voltage battery. The high-voltage battery is an energy module that has in the interior of its housing a battery having a plurality of lithium-ion cells and two battery contacts, a battery management system for monitoring the charge state of the battery and for exchanging data between the battery and a control device or charge device, and a multi-pole plug socket for connecting a diagnostic device to the battery or to its battery management system. It is provided that a charging station for the high-voltage battery has a battery receptacle space that is similar to the battery receptacle space of the device operated by the high-voltage battery.

For charging high-voltage batteries, only high-voltage battery charge devices that are configured exclusively for charging the high-voltage battery are currently available on the market. In addition, there are separate devices for reading out from a battery management system of a high-voltage battery, i.e. so-called high-voltage battery diagnostic devices.

Here, a high-voltage battery is understood as an assemblage of individual battery cells, or an assemblage of battery modules, whose total voltage is greater than 60 V. In addition, in the present application, for simplicity the term "high-voltage battery" is understood to refer to an overall high-voltage battery or to individual or separated high-voltage battery modules.

Currently, there are no devices that are capable of bringing a high-voltage battery (i.e. an overall high-voltage battery or individual high-voltage battery modules) to a higher charge state (i.e., to charge them) and at the same time to additionally produce a diagnosis of the high-voltage battery by evaluating data from the battery management system of the high-voltage battery, and/or to bring the high-voltage battery to a defined lower charge state (i.e. to discharge it).

SUMMARY OF THE INVENTION

The present invention creates a device for testing and maintaining a high-voltage battery having the features described herein, and to a use of the device as described herein. Advantageous specific embodiments of the device are the subject matter of the further descriptions herein.

An aspect of the present invention is to combine a high-voltage battery charge device with a high-voltage battery diagnostic device according to the first variant disclosed below, or with a high-voltage battery charge device according to the second variant disclosed below, in each case in a single device. Of course, a high-voltage battery charge device can also be combined with a high-voltage battery diagnostic device and with a high-voltage battery discharge device in a single device.

As claimed, a device is provided for maintaining and servicing a high-voltage battery (including individual modules) that can be connected to the device. Here, a high-voltage battery that can be connected to the device is configured as an assemblage of individual battery cells, or as an assemblage of battery modules, and includes a high-voltage positive pole terminal and a high-voltage negative pole terminal and a battery management system having a data transmission terminal for the bidirectional transmission of battery management system data between the battery management system and an information-processing unit that is external relative to the high-voltage battery (including individual modules). The claimed device includes at least two or three devices selected from a group including the following: a high-voltage battery charge device, a high-voltage battery discharge device, and a high-voltage battery diagnostic device.

A high-voltage battery charge device is configured to bring a high-voltage battery connected to the device to a higher charge state, and includes the following: a high-voltage positive terminal that is configured to be connected to a high-voltage positive terminal of the high-voltage battery, and a high-voltage negative terminal that is configured to be connected to a high-voltage negative terminal of the high-voltage battery.

A high-voltage battery diagnostic device is configured to monitor a high-voltage battery connected to the device, and the device, for the presence of internal errors, to indicate recognized internal errors, and may also produce diagnostic data relating to the state of the high-voltage battery and to trigger functions that reliably bring the device and the high-voltage battery to a different state, to operate them, and/or to test them, and that includes an information-processing device having a data transmission terminal for the bidirectional transmission of battery management system data between the information-processing device and the battery management system of the high-voltage battery. According to the first variant, the device according to the present invention makes it possible to bring a high-voltage battery to any desired higher charge state with only a single device, specifically this device, and to perform diagnostic functions on the high-voltage battery in connection with the battery management system of the high-voltage battery.

A high-voltage battery discharge device is configured to bring a high-voltage battery connected to the device to a lower charge state, and comprises the following: a high-voltage positive terminal configured to be connected to the high-voltage positive terminal of the high-voltage battery, and a high-voltage negative terminal configured to be connected to the high-voltage negative terminal of the high-voltage battery. According to the second variant, the device according to the present invention makes it possible to bring a high-voltage battery into any desired higher, or also lower, charge state with only a single device, specifically this device. According to the second variant, the device according to the present invention makes it possible to bring a high-voltage battery to any desired higher, or also lower, charge state with only a single device, specifically this device.

The device further includes terminals required for a high-voltage battery, stimulus generators, and stimulus lines that are required to simulate a vehicle environment for the high-voltage battery. The stimulus data or stimulus signals produced by the stimulus generators and transmitted by the stimulus lines, i.e. signals from the operating environment required for the operation of a high-voltage battery, include, for a high-voltage battery as vehicle battery for an electric or hybrid vehicle, the following signals known to those skilled in the art: ignition (terminal 15), permanent positive (terminal 30), ground (terminal 31), and the interlock signal.

The device is further configured to carry out the above-described functions of the high-voltage battery charge device, the high-voltage battery diagnostic device, and/or the high-voltage battery discharge device for individual high-voltage modules, or for assemblages of high-voltage batteries.

In the present description, the term "charge state of a high-voltage battery" is understood to refer to a set of parameters that results from the current voltage of the high-voltage battery and from particular output values of the battery management system (i.e. of the battery control device).

In the present description, the term "servicing of a high-voltage battery" is understood to refer to an intervention in, or change in, the high-voltage battery, including for example an exchange of a battery module and subsequent assembly of the overall high-voltage battery after an error, or for example bringing a deeply discharged battery back to a normal charge state, if this is permitted by the battery manufacturer.

In the present description, the term "maintenance of a high-voltage battery" is understood as referring to a change in the charge state of an individual battery cell or of a battery module, including for example a balancing of charge between individual battery cells or battery modules, so that for example the high voltage never falls below a predefined value.

In the present description, the term "diagnosis of a high-voltage battery" is understood as referring to a set of steps of investigation carried out on a high-voltage battery, including at least one of the following: visual monitoring of a high-voltage battery, reading out of parameters, including in particular error parameters, from the battery management system of the high-voltage battery, error assessment of the high-voltage battery after reading out the errors, and a plausibility check of the values provided by the battery management system with measurement values that if warranted have been determined by the high-voltage battery charge device and high-voltage battery discharge device of the device according to the present invention.

Further Advantages of the Invention

If the device according to a first variant includes a high-voltage battery charge device and a high-voltage battery diagnostic device, the device can in addition include a high-voltage battery discharge device. If the device according to a second variant includes a high-voltage battery charge device and a high-voltage battery discharge device, then the device can in addition include a high-voltage battery diagnostic device. And if the device according to a third variant includes a high-voltage battery discharge device and a high-voltage battery diagnostic device, the device can in addition include a high-voltage battery charge device. These embodiments make it possible to bring a high-voltage battery, or individual high-voltage modules, to any desired higher or also lower charge state with only a single device, specifically the device according to the present invention, and, in connection with the battery management system of the high-voltage battery, to perform diagnostic functions on the battery, on individual high-voltage modules, and/or in the device.

The device can in addition include a safety device provided inside the information-processing unit, which safety device is configured to evaluate diagnostic data produced by the high-voltage battery diagnostic device and to produce reaction data that can be transmitted to a high-voltage battery connected to the device, e.g. via a data bus system that is essentially external relative to the device, such as a Controller Area Network (CAN), and that define the functions that are provided in order to operate and/or to test the high-voltage battery and/or the device in a safe state, and that is configured to bidirectionally transmit, e.g. via a data bus system that is essentially internal relative to the device, diagnostic data and/or reaction data between the safety device and the high-voltage battery diagnostic device. The safety device recognizes predefined safety risks whose occurrence is recognized on the basis of the diagnostic data and/or measurement data transmitted by the diagnostic device, and predefined reactions that are provided in order to transition the high-voltage battery or individual high-voltage modules, or the device, from a recognized case in which there is a safety risk to a safe state. In this way, the safety device enables a safe operation of a high-voltage battery connected to the device for servicing or maintenance.

In addition, the device can have a human-machine interface provided inside the information-processing unit, having the following: an output device for outputting or indicating battery management system data, diagnostic data, and reaction data, an input device for inputting of user control data by a user, and an input-output interface to which the output device and the input device are connected and that is configured to output user control data inputted by the user for transmission to the battery management system of the high-voltage battery, to the diagnostic device, or to the safety device. Alternatively or in addition, the human-machine interface can include a remote control unit having an output device for outputting or indicating battery management system data, diagnostic data, and reaction data, and/or an input device for inputting of user control data by a user.

Alternatively or in addition to the human-machine interface, the device can have a network terminal provided inside the information-processing unit that is configured to read in the user control data produced by a user for transmission to the battery management system of the high-voltage battery, to the diagnostic device, or to the safety device. The human-machine interface, or the network terminal, enables the outputting or indication of information for a user of the device regarding the state of a high-voltage battery connected to the device, and the inputting by the user of control data, for example in order to initiate specified maintenance or service processes at the high-voltage battery.

In particular, the output device of the human-machine interface can include an output arrangement selected from a group including the following: a monitor, a video projector, a touch screen, a printer, and/or a display. The input device of the human-machine interface can include an input arrangement selected from a group including the following: a keyboard, a mouse, a trackball, a graphics tablet, a joystick, a TrackPoint, a touchscreen, a light pen, and/or a touchpad. Alternatively or in addition, the human-machine interface can include a remote control unit having such an output arrangement and/or having such an input arrangement. Through these embodiments, the human-machine interface enables comprehensive and user-friendly operation of the device with regard to all its functions by a user, including in a working environment such as a repair shop, a battery charging station, or a battery storage site.

The human-machine interface can be configured to indicate at least one datum of the following data: output values of the battery management system of a high-voltage battery connected to the device, in particular at least one datum selected from a group of data including: a manufacturer, a serial number, a date of manufacture, a specification, a charge duration, a discharge duration, a maximum charge current, a maximum discharge current, a maximum charge power at a particular target voltage, a maximum discharge power at a particular target voltage, content of a log data file for a charge process, a content of a log data file for a discharge process, and a content of a log data file for a diagnostic process, and a charge state of a high-voltage battery connected to the device, in particular a battery voltage and output values of the battery management system of the high-voltage battery. Due to the fact that the named data can be represented, the human-machine interface enables the representation and inspection by a user for all conceivable important parameters characterizing the state of a high-voltage battery, including all parameters stored in the battery management system.

The battery management system of a high-voltage battery that can be connected to the device can contain information stored therein relating to the high-voltage battery specification, including a maximum charge current and a maximum charge power at a specified target voltage. Correspondingly, the high-voltage battery charge device can be configured to generate pulsed or linear current-time curves according to a setting of the high-voltage battery specification, and to feed them to a connected high-voltage battery. Through this embodiment, the device is suitable for charging high-voltage batteries of different types, in particular including different electrochemical types, in a manner matched correctly to the type.

The high-voltage battery charge device can include the following: an AC/DC converter and an AC mains connector for connecting the AC/DC converter to an external AC power network, and/or a DC/DC converter and a DC supply connector for connecting the DC/DC converter to an external DC network, DC terminals that are connected to the outputs at the charge device side of the AC/DC converter or of the DC/DC converter, a current and voltage monitoring device for acquiring a charge current-time curve of a charge current fed to a high-voltage battery connected to the device, and for acquiring a charge voltage-time curve of a charge voltage applied to the high-voltage battery connected to the device, and a charge control device for controlling a charge current-time curve of a charge current fed to the high-voltage battery connected to the device, and for controlling a charge voltage-time curve of a charge voltage applied to the high-voltage battery connected to the device. The high-voltage battery charge device may also include a controllable charge current regulator. Through these embodiments, the high-voltage battery charge device is suitable for charging high-voltage batteries of different types, in particular including different electrochemical types, in an efficient (fast) and safe manner matched to the type.

The battery management system of a high-voltage battery that can be connected to the device can contain information stored therein relating to the high-voltage battery specification, including a maximum discharge current and a maximum discharge power at a specified target voltage. Correspondingly, the high-voltage battery discharge device can be configured to control an electrical load device that can be connected to a high-voltage battery connected to the device as electrical consumer in such a way that it can extract, or realize, pulsed or linear current-time curves according to a setting of the high-voltage battery specification from the high-voltage battery. Through this embodiment, the device is suitable for discharging high-voltage batteries of different types, in particular including different electrochemical types, correctly in a manner matched to the type.

The high-voltage battery discharge device can be configured to thermally utilize electrical power taken or converted from a high-voltage battery connected to the device, to feed this power back into an external power network, or to feed it to a different high-voltage battery connected to the device. Through these embodiments, the electrical power taken from a high-voltage battery is not wasted, but rather is rationally used or stored elsewhere.

Alternatively or in addition, the high-voltage battery discharge device can include the following: a controllable load switch, the electrical load device, a current and voltage monitoring device for acquiring a discharge current-time curve of a discharge current taken from a high-voltage battery connected to the device, and for acquiring a discharge voltage-time curve of a discharge voltage produced by the high-voltage battery connected to the device, and a discharge control device for controlling a discharge current-time curve of a discharge current taken from a high-voltage battery connected to the device, and for controlling a discharge voltage-time curve of a discharge voltage produced by a high-voltage battery connected to the device. In particular, the electrical load device can include a controllable ohmic resistance for the thermal utilization of the electrical power taken from the high-voltage battery, or it can feed the received electrical power to the external power network (AC mains network or DC network). Through these embodiments, the high-voltage battery discharge device is suitable for discharging high-voltage batteries of different types, in particular including different electrochemical types, in an efficient (fast) and safe manner matched to the type.

A high-voltage battery diagnostic device can be configured to receive, evaluate, and store a log data file for a charge process, a log data file for a discharge process, and/or a log data file for a diagnostic process via the information-processing unit from a battery management system of a high-voltage battery connected to the device. This makes it possible to transmit processes significant for the pre-history or the state of a high-voltage battery, including chargings, dischargings, and diagnoses, for storage from the battery management system. On the basis of the stored data and/or measured actual values relating to the state of the high-voltage battery, a more detailed or more profound diagnosis of the high-voltage battery can be carried out or created.

The device can in addition include a data bus system for transmitting real-time data that can include in particular a Controller Area Network (CAN) configured essentially for external bidirectional data transfer, and a data bus system that is internal relative to the device. The data bus system can be configured to connect the following components to one another in terms of communication: the charge device, which may be via its data transmission terminal, the discharge device, which may be via its data transmission terminal, the diagnostic device, the information-processing unit, in particular a communication device provided therein having the data transmission terminal, and a high-voltage battery connected to the device, which may be via its data transmission terminal. The data bus system makes it possible for all components of the device and a connected high-voltage battery to be equally authorized with regard to availability and retrievability of information or data, and to share this data. The Controller Area Network (CAN) originally developed by the applicant of the present patent application is mentioned here only as an example of an external data bus system. Instead, a different data bus system having differently realized data transmission interfaces and protocols may also be provided.

The data bus system can be configured to transmit at least one datum that is selected from a group including the following: codes for internal errors, codes for functions and values of parameters for the functions, diagnostic data, reaction data, user control data, and battery management system data, in particular of a battery management system of a high-voltage battery connected to the device, including the transmission of at least one datum selected from a group including the following: a manufacturer, a serial number, a date of manufacture, a high-voltage battery specification, a charge duration, a discharge duration, a maximum charge current, a maximum discharge current, a maximum charge power at a specified target voltage, a maximum discharge power at a specified target voltage, a content of a log data file for a charge process, a content of a log data file for a discharge process, and a content of a log data file for a diagnostic process. In this way, it is ensured that all components of the device and of a connected high-voltage battery are equally authorized to be supplied with all information or data important for assessing the state, including the charge state, of the high-voltage battery.

A high-voltage battery maintenance and servicing device as described above can be used for the following application: for servicing a high-voltage battery or an individual high-voltage module, for maintenance of a high-voltage battery or of an individual high-voltage module, for setting a high-voltage battery or an individual high-voltage module to any desired specified charge state, in particular a higher or lower one, for pre-conditioning of the high-voltage battery or of the individual high-voltage module according to specifications of the manufacturer, for example before installing the high-voltage battery or the individual high-voltage module in a new electric or hybrid vehicle, or after a repair has been made to an electric or hybrid vehicle before the electric or hybrid vehicle is picked up, for servicing, maintenance, and/or diagnosis of a high-voltage battery or of an individual high-voltage module in a repair shop, or for servicing, maintenance, and/or diagnosis of a high-voltage battery or of an individual high-voltage module at a high-voltage battery storage site.

In the following, the present invention is described in further detail on the basis of specific embodiments of the present invention shown in the accompanying Figures.

DETAILED DESCRIPTION

Figure 1:
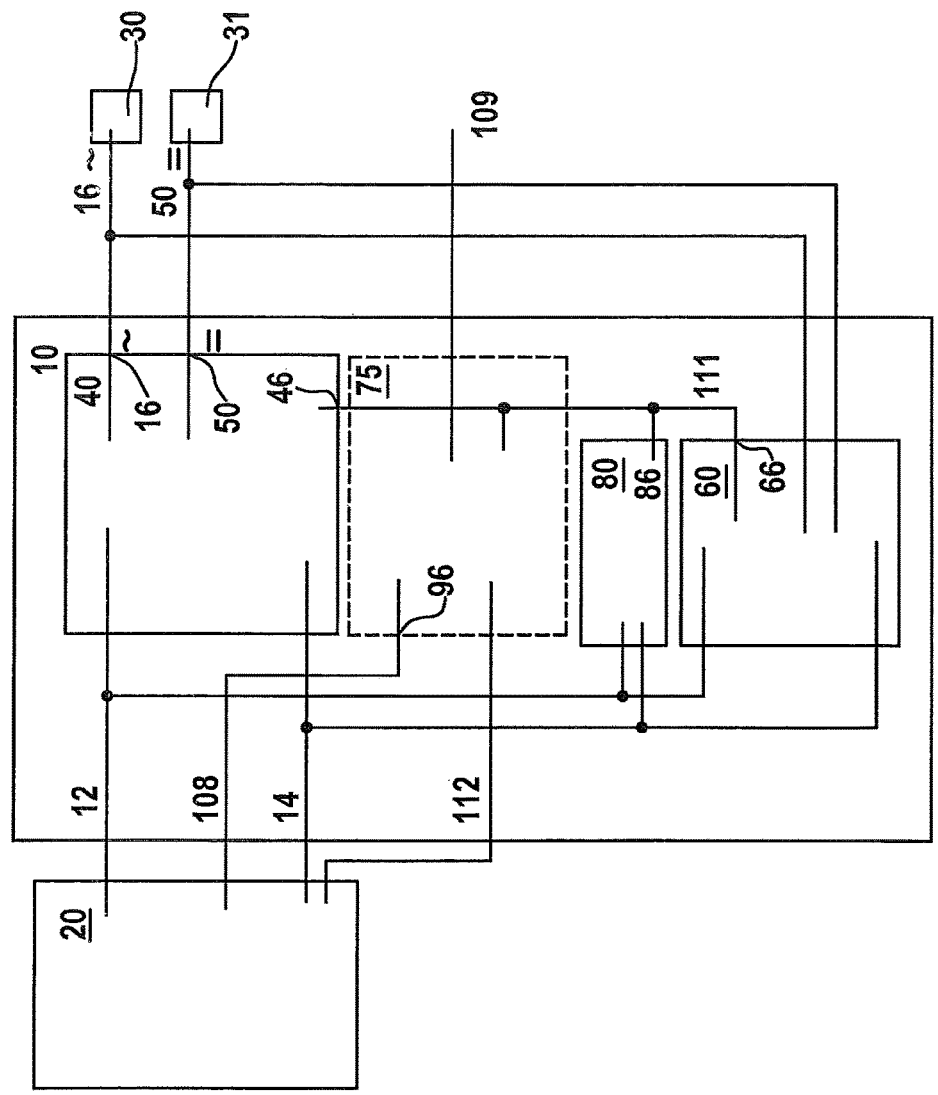
FIG. 1 shows a schematic diagram of a specific embodiment of a device for servicing and maintenance of a high-voltage battery.

The specific embodiment shown in FIG. 1 of a device 10 for servicing and maintenance of a high-voltage battery includes a high-voltage battery charge device 40, a high-voltage battery discharge device 60, and a high-voltage battery diagnostic device 80. It is to be noted that the present invention can include three variants, (i), (ii), and (iii). According to variant (i), device 10 has, in addition to a high-voltage battery charge device 40, a high-voltage battery discharge device 60, but does not have a high-voltage battery diagnostic device 80. According to variant (ii), device 10 has, in addition to a high-voltage battery charge device 40, a high-voltage battery diagnostic device 80, but does not have a high-voltage battery discharge device 60. According to variant (iii), device 10 has, in addition to a high-voltage battery charge device 40, a high-voltage battery discharge device 60, but does not have a high-voltage battery diagnostic device 80.

Charge device 40 is configured to take a high-voltage battery connected to device 10 to a higher charge state through pulsed or linear current curves, according to a setting from the battery specification. Discharge device 60 is configured to take high-voltage battery 20 connected to device 10 to a lower charge state through pulsed or linear current curves according to a setting from the battery specification. Discharge device 60 can utilize the energy taken from high-voltage battery 20 thermally, via the controllable ohmic resistor 71, can feed it back into external power network 30, or can supply it to another high-voltage battery connected to device 10, for charging thereof.

Device 10 shown in FIG. 1 also has an information-processing unit 75 that has, inter alfa, a safety device 90 and a human-machine interface 100. During operation, device 10 is connected to an external AC power network 30 and/or to an external DC network 31. Charge device 40, discharge device 60, diagnostic device 80, information-processing unit 75 including its components (see below and FIG. 2), in particular safety device 90, and human-machine interface 100 are connected to one another in terms of communication through a data bus system 111 that is essentially internal relative to device 10. High-voltage battery 20 or an individual module (not shown) are connected, via an external data bus system 108, to information-processing unit 75 of device 10. Here, data bus system 108 can be the so-called Controller Area Network (CAN) developed by the applicant of the present patent application. The Controller Area Network is a high-integrity, i.e. well-secured against external disturbing impulses, serial data communication bus system for real-time applications that can be operated with data rates of up to 1 Mb per second, and that has excellent error recognition and error correction possibilities. Controller Area Network 109 was originally developed for use in motor vehicles. Since then, it has come to be used in many other industrial automation and control applications, and has become an international standard, namely ISO 11898. Via internal data bus system 111, devices 40, 60, 80, 90, and 100 exchange measurement parameters, messages, status notifications, error messages, and/or execution commands among one another, and also, via external data bus system 108, with a high-voltage battery 20 connected to device 10.

Figure 2:
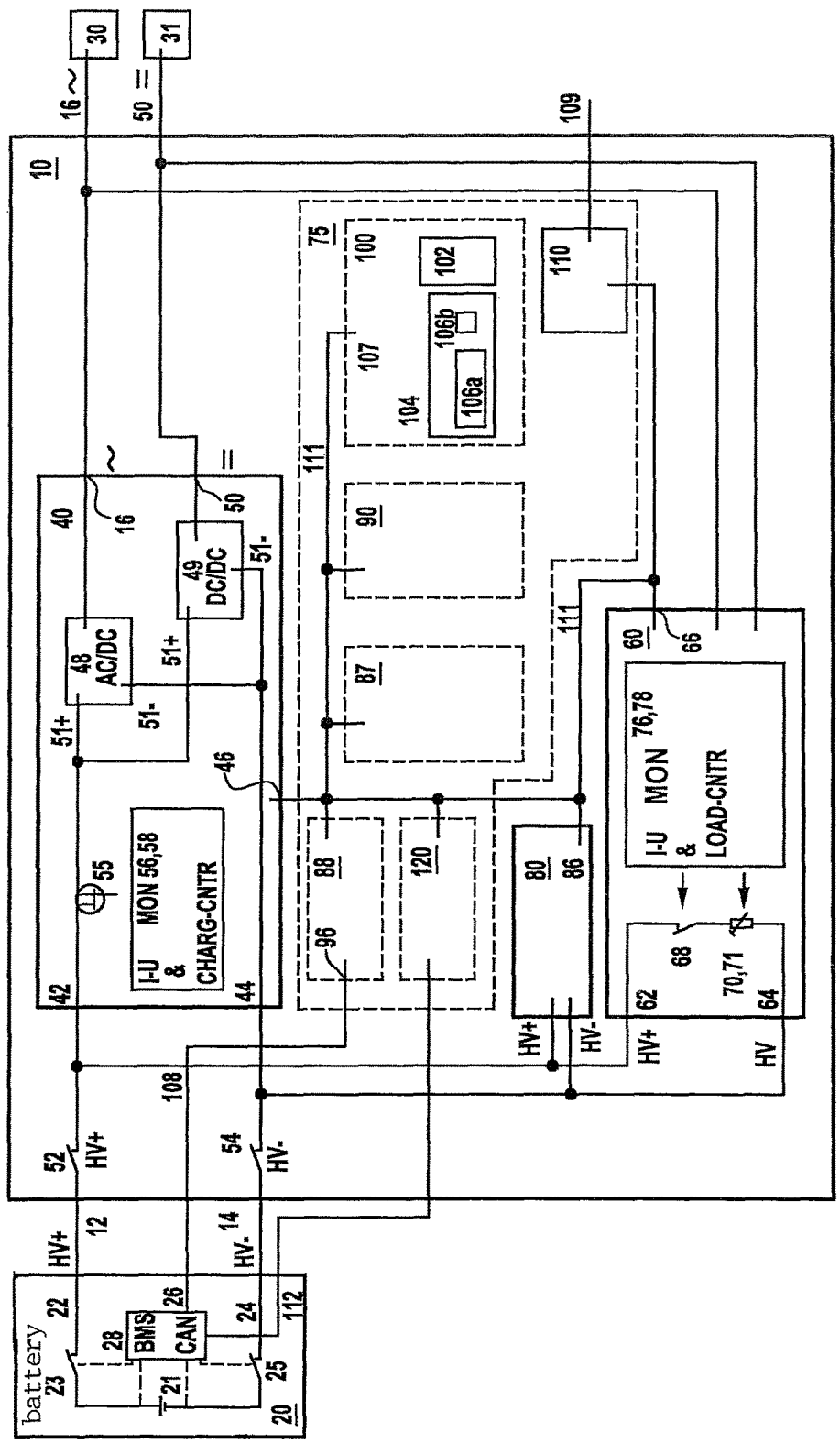
FIG. 2 shows a more complete diagram of the device of FIG. 1, including a current flow plan and a schematic representation of individual components of the high-voltage battery charge device, the high-voltage battery discharge device, and of the high-voltage battery diagnostic device of the device of FIG. 1.

Details of the internal design, and a current flow plan, of the devices 40, 60, 75, and 80 of device 10, shown in FIG. 1, and of a high-voltage battery 20 connected to device 10, are shown in FIG. 2.

High-voltage battery 20 shown in FIG. 2 includes a high-voltage battery module 21 having two voltage poles "plus" and "minus," a high-voltage positive terminal 22, or HV+, that is connected to the anode side of battery module 21 via a controllable high-voltage battery positive switch 23, a high-voltage negative terminal 24, or HV−, that is connected to the cathode side of battery module 21 via a controllable high-voltage battery negative switch 25, and a battery management system, or battery control device 28, that is connected to data bus system 108 of device 10 via a data transmission terminal 26. In addition, a stimulus generator 120 produces stimulus data or stimulus signals that are required by the high-voltage battery, or an individual high-voltage module, for operation or for simulation of a vehicle environment. The stimulus data or stimulus signals produced by stimulus generator 120 and transmitted via stimulus lines 112, i.e. signals from the operating environment required for the operation of a high-voltage battery, include, for high-voltage battery 20 as vehicle battery for an electric or hybrid vehicle (not shown), the following signals known to those skilled in the art: ignition (terminal 15), permanent positive (terminal 30), ground (terminal 31), and the interlock signal.

Battery management system 28 is configured to measure the current operating voltage of battery module 21 and the partial voltages of all individual battery cells installed in battery module 21, to close and open high-voltage battery positive switch 23, and also to close and open high-voltage battery negative switch 25. Battery management system 28 is in addition configured to store, and keep in readable form, a high-voltage battery log data file for a charge process, a high-voltage battery log data file for a discharge process, or a high-voltage battery blog data file for a diagnostic function, communicated by device 10 via data bus system 108 or 109 and data transmission terminal 26. In addition, in battery management system 28 there are stored, in readable form, parameters that describe high-voltage battery 20, or individual battery modules 21, including for example information concerning the manufacturer, serial numbers, and dates of manufacture of the battery modules or individual battery cells, a charge voltage, a charge duration, a maximum charge power, or a maximum charge power for a specified target voltage, a charge state of high-voltage battery 20, a maximum discharge duration, a minimum operating voltage, a maximum discharge depth (expressed e.g. in volts), a maximum discharge power for a specified target voltage, error codes and items of error information, as well as items of information concerning charge balancings. In addition, high-voltage battery 20 is provided, via battery stimulus lines 112, with the items of information or stimuli produced by stimulus generator 120, required for operation of high-voltage battery 20 outside a vehicle.

High-voltage charge device 40 shown in FIG. 2 has a high-voltage positive terminal 42, or HV+, a high-voltage negative terminal 44 or HV−, a data transmission terminal 46 for communicative connection to internal data bus system 111, a controllable high-voltage positive switch 52, a controllable high-voltage negative switch 54, a current and voltage monitoring device 56 for monitoring and recording charge voltages, charge currents, and their temporal curves, a charge control device 58, and an AC-DC converter 48 having an AC terminal 50 (mains terminal) for connection to an external AC power network 30, and/or a DC-DC converter 49 having a DC supply terminal 54 connection to an external DC network 31, and having DC terminals 51+ and 51− that are connected in electrically conductive fashion to the outputs at the charge device side of AC/DC converter 48, or of DC/DC converter 49. In addition, DC terminal 51+ is connected in electrically conductive fashion to high-voltage positive terminal 42 via controllable high-voltage positive switch 52. In addition, DC terminal 51− is connected in electrically conductive fashion to high-voltage negative terminal 44 via controllable high-voltage negative switch 54. Current and voltage monitoring device 56, and charge control device 58, are connected in terms of communication, via data transmission terminal 46, to communication device 88 inside information-processing unit 75 (not shown in FIG. 2).

Charge control device 58 is configured to control a charge process for a connected high-voltage battery 20 on the basis of corresponding battery parameters read out from battery management system 28 of high-voltage battery 20. For this purpose, charge control device 58 can open and close controllable high-voltage positive switch 52, or controllable high-voltage negative switch 54, and, in the closed state of switches 52, 54, can regulate a charge current fed to connected high-voltage battery 20 using controllable charge current regulator 55.

High-voltage battery discharge device 60 has a high-voltage positive terminal 62, a high-voltage negative terminal 64, a data transmission terminal 66 for connection in terms of communication of discharge device 60 to internal data bus system 111, a closeable discharge current circuit that internally connects high-voltage positive terminal 62 to high-voltage negative terminal 64 and in which the following electrical elements are installed or connected serially: a controllable high-voltage positive switch 72, a controllable load switch 68, a controllable electrical load device 70 having a controllable ohmic resistance 71, and a controllable high-voltage negative switch 74. Discharge device 60 further includes a current and voltage monitoring device 76 for measuring and recording a discharge voltage and a discharge current, as well as the temporal curves thereof, and a discharge control device 78 for controlling a discharge process of a high-voltage battery 20 connected to device 10 in accordance with battery parameters that have been read out from battery management system 28 of high-voltage battery 20 via data bus system 108 and data transmission terminal 66. Current and voltage monitoring device 76 and discharge controlling device 78 are connected in terms of communication to data transmission terminal 66 (not shown in FIG. 2).

Discharge control device 78 is configured to open and close controllable high-voltage positive switch 72, or controllable high-voltage negative switch 74. In addition, discharge control device 78 is configured to open and to close load switch 68, and to control a discharge power or discharge current from connected high-voltage battery 20 using electrical load device 70, in particular ohmic resistance 71.

High-voltage battery diagnostic device 80 includes a high-voltage positive terminal HV+ and a high-voltage negative terminal HV−, as well as a data transmission terminal 86 for connection to internal data bus system 111, for connection in terms of communication to the other components of device 10, in particular to communication device 88 in information-processing unit 75, and, via communication device 88, or its data communication terminal 96, a connection in terms of communication to external data bus system 108 and to battery management system 28 of a high-voltage battery 20 connected to device 10 for the evaluation of a battery status, as read for example from battery management system 28, and for the evaluation of high-voltage battery log data files for a charge process, controlled by charge device 40 or its charge control device 58, of high-voltage battery 20 connected to device 10, and for evaluating a high-voltage battery log data file for a discharge process, controlled by discharge device 60 or its discharge control device 78, of high-voltage battery 20 connected to device 10.

Information-processing unit 75 further includes an evaluation and control device 87 for controlling charge device 40 or its charge control device 58, or a charge process of high-voltage battery 20 connected to device 10, and/or discharge device 60, or its discharge control device 78, or a discharge process of high-voltage battery 20 connected to device 10, in each case via data bus system 111. Information-processing unit 75 further includes the already-mentioned communication device 88 for controlling the communication via external data bus system 108 (e.g. CAN) with battery management system 28 of high-voltage battery 20, and, via internal data bus system 111, with charge device 40, discharge device 60, safety device 90, human-machine interface 100 of device 10, or a remote control (not shown) for device 10. Thus, communication device 88 controls in particular the transmission of data from and to human-machine interface 100, or from and to the remote control. In addition, information-processing unit 75 includes a network 110, for example having a USB terminal, for connecting external devices, as well as safety device 90 and battery stimulus generator 120.

Human-machine interface 100 has an output device 102, such as a monitor, for outputting information to an operator of device 10, an input device 104 for inputting of user control data by the operator, such as an external keyboard 106a and an external mouse 106b, and an input-output interface 107 to which output device 102 and input device 104 are connected, and that is configured to transmit user control data inputted by the operator via internal data bus system 111 to data transmission terminal 86 of diagnostic device 80 and/or to data transmission terminal 46 of charge device 40 and/or to data transmission terminal 66 of discharge device 60 and/or to communication device 88, and, via its data transmission terminal 96 and external data bus system 108, to data transmission terminal 26 of connected high-voltage battery 20. In addition or alternatively to the above-named human-machine interface 100, device 10 can also have a network terminal 109 and/or a remote control for indicating battery management system data, diagnostic data, and/or reaction data, or for inputting user control data.

Evaluation and control device 87 is configured to control the following functions: evaluation of information concerning a high-voltage battery 20 connected to device 10, monitoring of charge device 40 and/or of discharge device 60 for correct operation, checking a high-voltage battery 20 connected to device 10, charge device 40, and discharge device 60 for the occurrence of errors, producing indication commands for indicating the errors when errors are recognized, and transmitting these commands to human-machine interface 100 for display, and carrying out functions in connection with a diagnosis of the high-voltage battery connected to device 10, the functions being started by diagnostic device 80, including reading out from the data storage device of battery management system 28. In addition, evaluation and control device 87 is configured to produce diagnostic data relating to the state of high-voltage battery 20, and to transmit these data to human-machine interface 100 for display and to safety device 90 for processing.

Safety device 90 is configured to evaluate diagnostic data produced by evaluation and control device 87 of diagnostic device 80, and to produce reaction data that define functions that are directed to bring high-voltage battery 20 and/or device 10 into a safe state, for example a lower charge state. In addition, safety device 90 is configured to transmit the produced reaction data via data bus system 108 to diagnostic device 80, to charge device 40, and/or to discharge device 60, as well as, if warranted, to battery management system 28 of high-voltage battery 20.

Thus, diagnostic device 80 checks high-voltage battery 20 and the components of device 10, including charge device 40 and discharge device 60, internally for errors, provides for the displaying of the errors via human-machine interface 100, and/or carries out functions that are started by diagnostic device 80 itself or by safety device 90. As a function of diagnostic data produced in diagnostic device 80, safety device 90 produces reaction data that are transmitted to diagnostic device 80, to charge device 40, and/or to discharge device 60, and, if warranted, to high-voltage battery 20, and that are directed to bring high-voltage battery 20 and/or device 10 to a safe state in case of error. Error cases can include for example the following: a failure of communication to high-voltage battery 20, an interruption or unplugging of the cabling (i.e. of the cable carrying battery current between high-voltage positive terminal 22 of high-voltage battery 20 and high-voltage positive terminal 42 or 62, or between high-voltage negative terminal 24 and high-voltage negative terminal 44 or 64), or the occurrence of insulation errors, etc.

In addition, diagnostic device 80 is configured to recognize whether various battery modules of high-voltage battery 20 have the same or different charge levels, and, if warranted, to carry out a charge balancing between the various battery modules, for example with activation of battery management system 28.

What is claimed is:

1. A device for servicing and maintaining a high-voltage battery, which is connectable thereto, comprising:
a connection for connecting to the high-voltage battery;
a high-voltage battery charge device to bring the high-voltage battery to a higher charge state, and having a high-voltage positive terminal which is connectable to a high-voltage positive terminal of the high-voltage battery, and a high-voltage negative terminal which is connectable to a high-voltage negative terminal of the high-voltage battery, wherein the high-voltage battery includes an assemblage of individual battery cells or an assemblage of battery modules, the high-voltage positive terminal, the high-voltage negative terminal, and a battery management system having a data transmission terminal;
a high-voltage battery diagnostic device to check the high-voltage battery for internal errors, to display recognized internal errors, and having an information-processing unit, which is external relative to the high-voltage battery, having the data transmission terminal to bidirectionally transmit battery management system data between the information-processing unit and the battery management system of a connected high-voltage battery, wherein the high-voltage battery charge device and the high-voltage battery diagnostic device are housed together in a single housing that is external to the high-voltage battery; and
a safety device, inside the information-processing unit, to evaluate diagnostic data produced by the high-voltage battery diagnostic device and to produce reaction data that is transmittable to the high-voltage battery via a data bus system that is essentially external relative to the device, including a Controller Area Network (CAN), and that define functions directed to operating the high-voltage battery and/or the device in a safe state or testing it, and that is configured to bidirectionally transmit, via a data bus system that is essentially internal relative to the device, diagnostic data and/or reaction data between the safety device and the high-voltage battery diagnostic device.

2. The device of claim 1, further comprising:
a human-machine interface, provided inside the information-processing unit, including:

an output device to output or display battery management system data, diagnostic data, and reaction data,
an input device to input user control data by a user, and
at least one of:
- an input-output interface to which the output device and the input device are connected, and that is configured to output user control data inputted by the user, for transmission to the battery management system of the high-voltage battery, to the diagnostic device, or to the safety device,
- a remote control having an output device for outputting or displaying battery management system data, diagnostic data, and reaction data, and/or having an input device for inputting of user control data by a user, and
- a network terminal, provided inside the information-processing unit, that is configured to read in user control data produced by a user for transmission to the battery management system of the high-voltage battery, to the diagnostic device, or to the safety device.

3. The device of claim 2, wherein the human-machine interface and/or the remote control is configured to display at least one datum selected from a group including the following:
- output values of the battery management system of the high-voltage battery, in particular at least one datum selected from a group of data including the following: a manufacturer, a serial number, a date of manufacture, a specification, a charge duration, a discharge duration, a maximum charge current, a maximum discharge current, a maximum charge power at a specified target voltage, a maximum discharge power at a specified target voltage, a content of a log data file for a charge process, a content of a log data file for a discharge process, and a content of a log data file for a diagnostic process, and
- a charge state of the high-voltage battery, in particular a battery voltage and output values of the battery management system of the high-voltage battery.

4. The device of claim 1, wherein the battery management system of the high-voltage battery contains information stored therein relating to the high-voltage battery specification, including a maximum charge current and a maximum charge power at a specified target voltage, and the high-voltage battery charge device is configured to produce pulsed or linear current-time curves in accordance with a setting of the high-voltage battery specification, and to feed them to the high-voltage battery.

5. The device of claim 4, wherein the high-voltage battery charge device includes:
- an AC/DC converter and an AC network terminal for connecting the AC/DC converter to an external AC mains network, and/or a DC/DC converter and a DC supply terminal for connecting the DC/DC converter to an external DC network,
- DC terminals that are connected to the outputs at the charge device side of the AC/DC converter or of the DC/DC converter,
- a controllable charge current regulator, a current and voltage monitoring device for acquiring a charge current-time curve of a charge current fed to a high-voltage battery connected to the device, and a charge voltage-time curve of a charge voltage applied to the high-voltage battery, and
- a charge control device for controlling a charge current-time curve of a charge current fed to a high-voltage battery connected to the device, and a charge voltage-time curve of a charge voltage applied to the high-voltage battery.

6. The device of claim 1, wherein the high-voltage battery diagnostic device is configured to receive, evaluate, and store a log data file for a charge process, a log data file for a discharge process, and/or a log data file for a diagnostic process via the information-processing unit from a battery management system of the high-voltage battery.

7. The device of claim 1, further comprising:
a data bus system for transmitting real-time data that contains in particular a Controller Area Network configured essentially for external bidirectional data transfer, and a data bus system that is internal relative to the device, the data bus system being configured to connect the following to one another in terms of communication:
the charge device, via its data transmission terminal,
the discharge device, via its data transmission terminal,
the diagnostic device,
the information-processing unit, in particular a communication device provided therein with the data transmission terminal, and
the high-voltage battery, via its data transmission terminal;
wherein the data bus system is configured to transmit at least one datum selected from the group including the following: codes for internal errors, codes for functions and values of parameters for the functions, diagnostic data, reaction data, user control data, and battery management system data, in particular of a battery management system of the high-voltage battery, including at least one datum selected from a group including the following: a manufacturer, a serial number, a date of manufacture, a high-voltage battery specification, a charge duration, a discharge duration, a maximum charge current, a maximum discharge current, a maximum charge power at a specified target voltage, a maximum discharge power at a specified target voltage, a content of a log data file for a charge process, a content of a log data file for a discharge process, and/or a content of a log data file for a diagnostic process.

8. The device of claim 1, wherein it is used for at least one of the following:
servicing a high-voltage battery;
maintaining a high-voltage battery;
diagnosing a high-voltage battery;
putting the high-voltage battery into an arbitrary specified charge state for the pre-conditioning of the high-voltage battery in accordance with manufacturer specifications, including before installing the high-voltage battery in a new electric or hybrid vehicle, or after a repair operation on an electric or hybrid vehicle before the electric or hybrid vehicle is picked up,
servicing, maintaining, and/or diagnosing a high-voltage battery in a repair shop, or
servicing, maintaining, and/or diagnosing a high-voltage battery at a high-voltage battery storage site.

9. The device of claim 1, wherein the high-voltage battery diagnostic device is also configured preferably to produce diagnostic data relating to the state of the high-voltage battery, and to trigger functions that are directed to bring the device and/or the high-voltage battery safely to a different state, to operate them, and/or to test them.

* * * * *